US012126204B2

(12) United States Patent
Sharma et al.

(10) Patent No.: US 12,126,204 B2
(45) Date of Patent: Oct. 22, 2024

(54) BATTERY MANAGEMENT UNIT TO DETERMINE UPDATED SOC AND ENERGY READING, ENERGY STORAGE SYSTEM COMPRISING, THE SAME, AND METHOD OF USING THE SAME

(71) Applicants: China Energy Investment Corporation Limited, Beijing (CN); National Institute of Clean-and-Low-Carbon Energy, Beijing (CN)

(72) Inventors: Ratnesh Sharma, Fremont, CA (US); Surinder Singh, Fremont, CA (US); Peng Yu, Fremont, CA (US); Brandon Ohara, Mountain View, CA (US)

(73) Assignees: China Energy Investment Corporation Limited, Beijing (CN); National Institute Of Clean-And-Low-Carbon Energy, Beijing (CN)

( * ) Notice: Subject to any disclaimer, the term of this patent is extended or adjusted under 35 U.S.C. 154(b) by 656 days.

(21) Appl. No.: 17/202,877

(22) Filed: Mar. 16, 2021

(65) Prior Publication Data
US 2022/0302724 A1    Sep. 22, 2022

(51) Int. Cl.
*H02J 7/00* (2006.01)
*G01R 31/3842* (2019.01)
(Continued)

(52) U.S. Cl.
CPC ........ *H02J 7/0048* (2020.01); *H02J 7/00036* (2020.01); *H02J 7/0013* (2013.01);
(Continued)

(58) Field of Classification Search
CPC .... H02J 7/0048; H02J 7/00036; H02J 7/0013; H02J 7/005
(Continued)

(56) References Cited

U.S. PATENT DOCUMENTS 6,107,779 A * 8/2000 Hara ................. G01R 31/3832
                                                320/132
6,981,159 B2 * 12/2005 Maeda ................. G06F 1/3203
                                                365/228
(Continued)

FOREIGN PATENT DOCUMENTS

CN      107121643 B    9/2017
CN      110518667 A    11/2019
(Continued)

OTHER PUBLICATIONS

Extended Search Report from European Application No. Application 22158920.3 dated Aug. 2, 2022 (11 pages).

*Primary Examiner* — John T Trischler
(74) *Attorney, Agent, or Firm* — Calfee, Halter & Griswold LLP

(57) ABSTRACT

A battery power management unit (BPMU), an electrical energy storage system comprising one or more such BPMUs, and method of using the same are provided. Such a BPMU includes a microcontroller and one or more processors having at least one tangible, non-transitory machine readable medium encoded with one or more programs. The BPMU is configured to perform steps of: reading data from the internal BMU of a respective battery pack to establish capacity, an energy baseline, state of health (SOH), and an initial value of state of charge (SOC) of the respective battery pack, checking voltage and current at a time interval, calculating power of the respective battery pack, determining and updating battery date such as SOH and SOC, and (Continued)

transmitting updated battery data to a system controller for controlling discharging power from or charging power to the respective battery pack.

17 Claims, 12 Drawing Sheets

(51) Int. Cl.
*G01R 31/392* (2019.01)
*H01M 10/42* (2006.01)
*H01M 10/44* (2006.01)
*H02J 3/32* (2006.01)
*H02J 7/04* (2006.01)

(52) U.S. Cl.
CPC .......... *H02J 7/005* (2020.01); *G01R 31/3842* (2019.01); *G01R 31/392* (2019.01); *H01M 10/425* (2013.01); *H01M 2010/4271* (2013.01); *H01M 2010/4278* (2013.01); *H01M 10/441* (2013.01); *H02J 3/32* (2013.01); *H02J 7/00032* (2020.01); *H02J 7/0047* (2013.01); *H02J 7/0068* (2013.01); *H02J 7/00712* (2020.01); *H02J 7/04* (2013.01); *H02J 2207/20* (2020.01)

(58) Field of Classification Search
USPC ......................................................... 320/126
See application file for complete search history.

(56) References Cited

U.S. PATENT DOCUMENTS

| | | | | |
|---|---|---|---|---|
| 7,362,076 B2* | 4/2008 | Namba | ............... | G01R 31/367 320/149 |
| 7,388,800 B2* | 6/2008 | Maeda | ............... | G06F 1/3275 365/228 |
| 7,570,022 B2* | 8/2009 | Zettel | ............... | H02J 7/0069 320/132 |
| 7,688,032 B2* | 3/2010 | Kamishima | ........ | G01R 31/3828 320/132 |
| 8,421,414 B2* | 4/2013 | Lee | ............... | G06F 1/263 320/132 |
| 9,153,846 B2* | 10/2015 | Liang | ............... | H01M 10/617 |
| 9,312,576 B2* | 4/2016 | Hung | ............... | H01M 10/44 |
| 9,442,165 B2* | 9/2016 | Asghari | ............... | H02J 7/34 |
| 9,535,480 B2* | 1/2017 | Ye | ............... | G06F 1/263 |
| 9,568,931 B2* | 2/2017 | Ye | ............... | H02J 7/34 |
| 9,733,657 B2* | 8/2017 | Ye | ............... | H02J 3/24 |
| 9,753,511 B2* | 9/2017 | Ye | ............... | G06N 7/02 |
| 9,866,029 B2* | 1/2018 | Shi | ............... | H02J 3/28 |
| 9,906,057 B2* | 2/2018 | Guo | ............... | H02M 7/4835 |
| 9,925,888 B2* | 3/2018 | Chang | ............... | B60L 50/66 |
| 9,964,572 B2* | 5/2018 | Shi | ............... | G01R 19/2513 |
| 9,966,777 B2* | 5/2018 | Guo | ............... | H02M 7/4835 |
| 10,250,039 B2* | 4/2019 | Wenzel | ............... | G01R 31/367 |
| 10,298,042 B2* | 5/2019 | Pourmousavi Kani | . | H02J 3/381 |
| 10,333,306 B2* | 6/2019 | Hooshmand | ........... | G06Q 10/04 |
| 10,333,307 B2* | 6/2019 | Hooshmand | ........... | G06N 20/00 |
| 10,422,835 B2* | 9/2019 | Kani | ............... | G01R 31/367 |
| 10,452,032 B1 | 10/2019 | de Callafon | ............ | H02J 3/322 |
| 10,673,241 B2* | 6/2020 | Nakayama | ............ | H02J 3/381 |
| 10,673,242 B2* | 6/2020 | Nakayama | ............ | G06Q 50/06 |
| 10,797,495 B2* | 10/2020 | Chen | ............... | H01M 10/4257 |
| 10,855,081 B2 | 12/2020 | Wenzel et al. | | |
| 10,899,247 B2* | 1/2021 | Chang | ............... | G01R 31/3842 |
| 10,992,143 B2* | 4/2021 | Chen | ............... | H02J 7/0042 |
| 11,131,713 B2* | 9/2021 | Hooshmand | ........... | G06N 20/20 |
| 11,296,511 B2* | 4/2022 | Wenzel | ............... | G01R 31/367 |
| 11,444,466 B2* | 9/2022 | Hira | ............... | H02J 3/381 |
| 11,486,931 B2* | 11/2022 | Kiuchi | ............... | H02J 3/32 |
| 11,652,357 B1* | 5/2023 | Sharma | ............... | H02J 7/0024 307/82 |
| 11,668,757 B2* | 6/2023 | Bourilkov | .......... | H01M 10/4257 429/7 |
| 11,721,992 B2* | 8/2023 | Bartels | .................. | H02J 7/0063 320/134 |
| 11,799,140 B2* | 10/2023 | Sharma | ................. | H02J 7/0048 |
| 2002/0120811 A1* | 8/2002 | Maeda | ...................... | G06F 1/30 713/320 |
| 2005/0249011 A1* | 11/2005 | Maeda | ...................... | G06F 1/30 365/222 |
| 2006/0176024 A1* | 8/2006 | Zettel | ........................ | H02J 7/14 320/132 |
| 2006/0220619 A1* | 10/2006 | Namba | ................ | G01R 31/367 320/149 |
| 2008/0030169 A1* | 2/2008 | Kamishima | ........ | G01R 31/3828 320/134 |
| 2011/0109272 A1* | 5/2011 | Lee | .......................... | G06F 1/263 320/132 |
| 2011/0130907 A1* | 6/2011 | Gau | ........................ | B60W 10/26 320/132 |
| 2011/0225345 A1* | 9/2011 | Inoue | ..................... | G06F 3/0683 711/E12.008 |
| 2012/0208672 A1* | 8/2012 | Sujan | ..................... | B60K 6/442 180/65.265 |
| 2012/0215368 A1* | 8/2012 | Sharma | ..................... | H02J 3/32 700/297 |
| 2013/0024042 A1* | 1/2013 | Asghari | ..................... | H02J 9/00 700/295 |
| 2013/0127423 A1* | 5/2013 | Liang | .................... | H02J 7/0025 429/153 |
| 2013/0207594 A1* | 8/2013 | Hung | .................... | H01M 10/44 320/162 |
| 2014/0088897 A1* | 3/2014 | Sharma | ................... | G06F 30/23 702/63 |
| 2014/0139191 A1* | 5/2014 | Asghari | ................ | H01M 10/48 320/134 |
| 2014/0375125 A1* | 12/2014 | Ye | .............................. | H02J 3/24 307/26 |
| 2015/0142190 A1* | 5/2015 | Ye | .............................. | H02J 7/34 700/287 |
| 2015/0148973 A1* | 5/2015 | Ye | .............................. | H02J 1/10 700/286 |
| 2015/0149799 A1* | 5/2015 | Ye | .............................. | G06N 7/02 713/320 |
| 2015/0261892 A1* | 9/2015 | Bozchalui | .................. | H02J 3/32 703/1 |
| 2016/0020628 A1* | 1/2016 | Guo | ..................... | H02M 7/4835 307/72 |
| 2016/0105020 A1* | 4/2016 | Guo | ........................ | H02J 7/342 307/31 |
| 2016/0126739 A1* | 5/2016 | Shi | ........................ | G01R 31/367 307/31 |
| 2016/0241031 A1* | 8/2016 | Hooshmand | ............... | H02J 3/38 |
| 2016/0241035 A1* | 8/2016 | Shi | ........................ | G01R 23/00 |
| 2017/0104332 A1* | 4/2017 | Wenzel | ................ | G01R 31/392 |
| 2017/0115358 A1* | 4/2017 | Kani | ................ | G01R 31/367 |
| 2017/0229881 A1* | 8/2017 | Pourmousavi Kani | . | H02J 3/381 |
| 2017/0253140 A1* | 9/2017 | Chang | .................... | H02J 7/16 |
| 2017/0310140 A1* | 10/2017 | Asghari | .................... | H02J 3/32 |
| 2017/0355276 A1* | 12/2017 | Chang | .................... | B60L 58/12 |
| 2018/0166878 A1* | 6/2018 | Hooshmand | ........... | G06Q 10/04 |
| 2018/0166880 A1* | 6/2018 | Hooshmand | ........... | H02J 7/0013 |
| 2019/0131797 A1* | 5/2019 | Chen | ................ | H01M 10/441 |
| 2019/0131808 A1* | 5/2019 | Chen | ................ | H01M 10/441 |
| 2019/0137956 A1* | 5/2019 | Hooshmand | ......... | G05B 13/042 |
| 2019/0147552 A1* | 5/2019 | Nakayama | ............... | H02J 3/38 700/291 |
| 2019/0148945 A1* | 5/2019 | Nakayama | ............... | H02J 3/38 700/291 |
| 2019/0257886 A1* | 8/2019 | Hooshmand | ........... | G06N 3/044 |
| 2019/0296552 A1* | 9/2019 | Wenzel | .................... | H02J 3/38 |
| 2019/0305386 A1* | 10/2019 | Lee | ................ | G01R 31/392 |
| 2019/0349426 A1* | 11/2019 | Smith | ................ | H04L 67/562 |
| 2019/0369166 A1* | 12/2019 | Moslemi | ................ | H02J 3/144 |
| 2020/0011932 A1* | 1/2020 | Hooshmand | ........ | H01M 10/482 |
| 2020/0309857 A1 | 10/2020 | Zeyghami et al. | | |
| 2021/0055351 A1* | 2/2021 | Kiuchi | ................ | H02J 7/0048 |
| 2021/0175713 A1* | 6/2021 | Wenzel | ................ | G01R 31/367 |

(56) References Cited

U.S. PATENT DOCUMENTS

| | | | |
|---|---|---|---|
| 2021/0296907 A1* | 9/2021 | Bourilkov | G01R 31/392 |
| 2022/0029435 A1* | 1/2022 | Bartels | H02J 7/0013 |
| 2022/0037900 A1* | 2/2022 | Hira | H02J 7/0013 |
| 2022/0060031 A1* | 2/2022 | Liu | H02J 7/007182 |
| 2022/0169139 A1* | 6/2022 | Brombach | B60L 53/67 |
| 2022/0291291 A1* | 9/2022 | Bourilkov | H01M 10/4257 |
| 2022/0294036 A1* | 9/2022 | Sharma | H02J 7/0013 |
| 2022/0344959 A1* | 10/2022 | Sharma | H02J 7/007182 |
| 2022/0368150 A1* | 11/2022 | Sharma | H02J 7/007184 |
| 2023/0117104 A1* | 4/2023 | Sharma | B60L 55/00 320/109 |
| 2023/0119821 A1* | 4/2023 | Sharma | H02J 7/00032 320/124 |
| 2023/0126838 A1* | 4/2023 | Sharma | H02J 7/0048 307/82 |
| 2023/0221377 A1* | 7/2023 | Bourilkov | G01R 31/392 429/90 |
| 2023/0305064 A1* | 9/2023 | Sharma | G01R 31/374 702/63 |

FOREIGN PATENT DOCUMENTS

| | | |
|---|---|---|
| EP | 3 547 705 A1 | 10/2019 |
| EP | 3 780 326 A1 | 2/2021 |
| WO | WO-0042689 A1 * 7/2000 | B60L 11/1861 |

* cited by examiner

BATTERY MANAGEMENT UNIT TO DETERMINE UPDATED SOC AND ENERGY READING, ENERGY STORAGE SYSTEM COMPRISING, THE SAME, AND METHOD OF USING THE SAME

PRIORITY CLAIM AND CROSS-REFERENCE

None.

FIELD OF THE INVENTION

The disclosure relates to systems and methods for energy storage generally. More particularly, the disclosed subject matter relates to a battery management unit, a system comprising such a battery management unit, and a method for monitoring and controlling stationary energy storage.

BACKGROUND

Clean and renewable sources of energy become more important due to increased concerns about environmental issues such as global warming. Such sources include solar and wind power, and rechargeable battery. Renewable energy sources are not flexible because they cannot be dispatched when needed to meet the changing requirements of energy consumers. Energy storage systems are expected to solve this flexibility challenge. A stationary energy storage system can store energy and release energy in the form of electricity when it is needed.

SUMMARY OF THE INVENTION

The present disclosure provides a battery power management unit (BPMU) for an electrical energy storage system, an electrical energy storage system comprising such a battery power management unit (BPMU), and methods of using the same.

In accordance with some embodiments, such an electrical energy storage system comprises a plurality of battery packs, one or more battery power management unit (BPMU), one or more power converters, and a system controller. Each battery pack comprises an internal battery management unit (BMU). Each BPMU is connected with at least one battery pack. The BPMU comprises a microcontroller and one or more processors having at least one tangible, non-transitory machine readable medium encoded with one or more programs. The BPMU is configured to perform steps of: reading data from the internal BMU of the respective battery pack to establish capacity, an energy baseline, and an initial value of state of charge (SOC) of the respective battery pack, checking voltage and current of the respective battery pack at a time interval, calculating power of the respective battery pack to integrate the power into an energy reading of the respective battery pack, and determining and updating state of charge (SOC) of the respective battery pack based on the initial value of SOC, the current, and the time interval. Each power converter is coupled with at least one battery pack and is configured to convert direct current (DC) from a respective battery pack to alternating current (AC) or vice versa. The system controller is used for controlling discharging power from or charging power to the respective battery pack based on updated data including the SOC and the energy reading of each respective battery.

The plurality of battery packs may be heterogeneous battery packs connected in parallel selected from new batteries, second-use electric vehicle (EV) batteries, or combinations thereof. In some embodiments, the plurality of battery packs are second-use electric vehicle (EV) batteries connected in parallel. The used EV batteries can be directly utilized in the system, without pre-selection or dismantling. Each battery pack comprises an inverter and an internal battery management unit (BMU) in the pack.

In some embodiments, each BPMU is also configured to determine state of health (SOH) of each respective battery pack based on the capacity of the respective battery pack. A suitable technique including, but not limited to, Coulomb counting, electrochemical impedance measurement, any other SOC estimation technique, or a combination thereof can be used in determining the SOH and the SOC of each respective battery pack. The system controller is configured to control discharging or charging each respective battery based on the SOH and the SOC of each respective battery pack, and a power command from an upper level energy management system (EMS).

In some embodiments, each BPMU is also configured to transmit the updated data of each respective battery pack such as the SOH, the SOC and the power or energy reading to the system controller.

In some embodiments, each BPMU is also configured to define an idle time for each respective battery pack so as to refresh the internal BMU of the respective battery pack.

In some embodiments, each BPMU further includes at least one CAN reader in the microcontroller, relay chips, and a power supply. The power supply has power output matched to those of the internal BMU of the respective battery and the CAN reader or readers.

In another aspect, the present disclosure provides a battery power management unit (BPMU) for an electrical energy storage system. The BPMU comprises a microcontroller configured to be connected with at least one battery pack, and one or more processors (such as a computer) connected with the microcontroller. The one or more processors have at least one tangible, non-transitory machine readable medium encoded with one or more programs. The BPMU is configured to perform steps of: reading data from the internal BMU of a respective battery pack to establish capacity, an energy baseline, and an initial value of state of charge (SOC) of the respective battery pack, checking or measuring voltage and current of the respective battery pack at a time interval, calculating power of the respective battery pack to integrate the power into an energy reading of the respective battery pack, and determining and updating state of charge (SOC) of the respective battery pack based on the initial value of SOC, the current, and the time interval. The BPMU is further configured to transmit updated data of the respective battery pack including the SOC and the energy reading to a system controller for controlling discharging power from or charging power to the respective battery pack based on the updated data of the respective battery pack.

In some embodiments, in the system comprising one or more BPMU, the battery pack is a new battery pack or second-use electric vehicle (EV) battery pack as described herein.

In some embodiments, the BPMU is also configured to determine state of health (SOH) of each respective battery pack based on the capacity of the respective battery pack. A suitable technique such as Coulomb counting, electrochemical impedance measurement, or a combination thereof can be used in determining the SOH and the SOC of each respective battery pack. The system controller is configured to control discharging or charging each respective battery based on the SOH and the SOC of each respective battery pack, and a power command from an upper level energy management system (EMS).

In some embodiments, the BPMU is also configured to define an idle time for each respective battery pack so as to refresh the internal BMU of the respective battery pack.

In some embodiments, each BPMU further includes at least one CAN reader in the microcontroller, relay chips, and a power supply, which has power output matched to those of the internal BMU of the respective battery and the at least one CAN reader.

In another aspect, the present disclosure provides a method for using a battery power management unit (BPMU) in an electrical energy storage system, or a method of operating the electrical energy storage system. Such a method comprises steps performed using the BPMU including: reading data from an internal BMU of a respective battery pack among a plurality of battery packs to establish capacity, an energy baseline, and an initial value of state of charge (SOC) of the respective battery pack, checking voltage and current of the respective battery pack at a time interval, calculating power of the respective battery pack to integrate the power into an energy reading of the respective battery pack, and determining and updating state of charge (SOC) of the respective battery pack based on the initial value of SOC, the current, and the time interval. The method may further include transmitting updated data of the respective battery pack including the SOC and the energy reading to a system controller for controlling discharging power from or charging power to the respective battery pack based on the updated data of the respective battery pack.

As described herein, the plurality of battery packs are heterogeneous battery pack selected from new battery, second-use electric vehicle (EV) battery packs, or a combination thereof, connected in parallel.

In some embodiments, the method further comprises determining state of health (SOH) of each respective battery pack based on the capacity of the respective battery pack. The SOH and the SOC of each respective battery pack, and a power command from an upper level energy management system (EMS) are used by the system controller for controlling discharging or charging each respective battery. A suitable technique such as Coulomb counting, electrochemical impedance measurement, or any other suitable technique, or a combination thereof is used for determining the SOH and the SOC of each respective battery pack.

In some embodiments, the method further comprises defining an idle time for each respective battery pack so as to refresh the internal BMU of the respective battery pack.

The BPMU, the system comprising the BPMU, and the methods provided in the present disclosure have many advantages. For example, the BPMU determine and provide real-time and reliable data of the battery packs, which are second-use EV batteries directly used in the system without dissembling. Such real-time and accurate data of battery packs are provided to the system controller for decision-making, for example, controlling discharging or charging the battery packs with better control. The life-time of the battery packs can be also extended through better control.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

Figure 1:
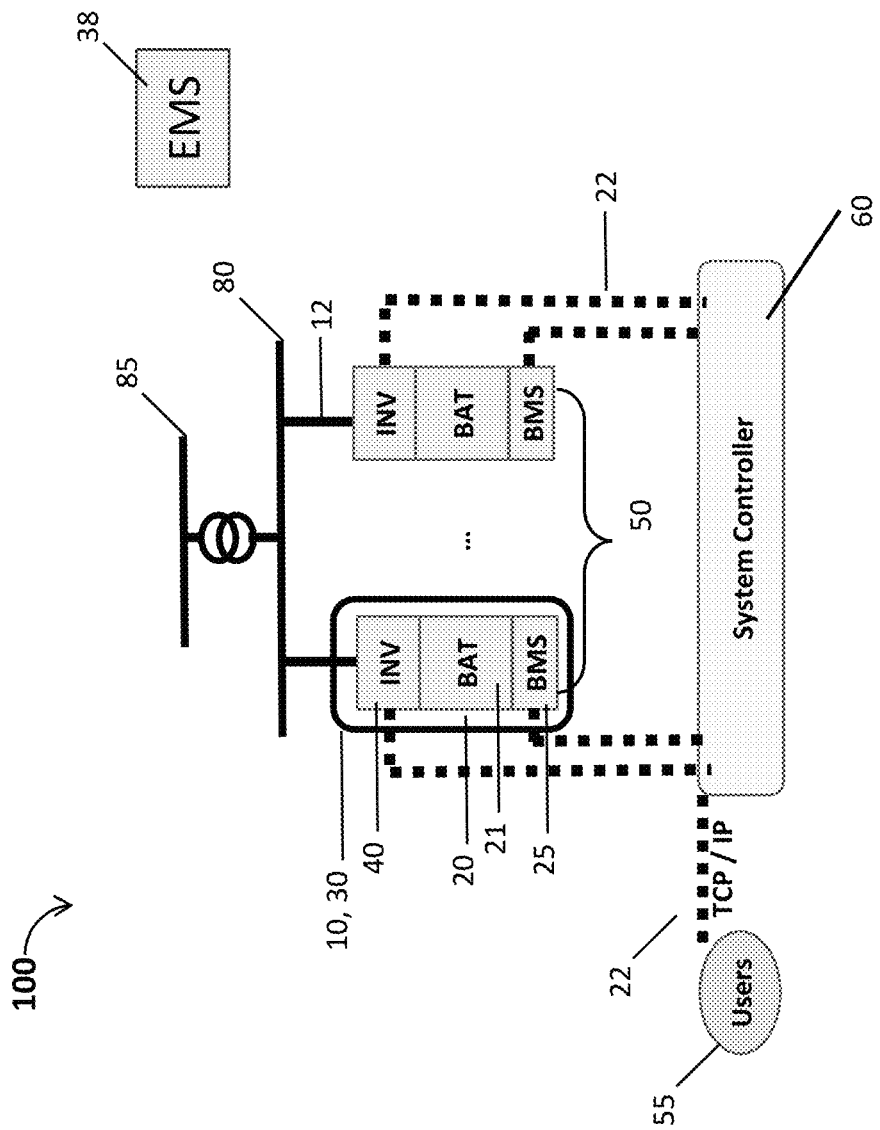
FIG. 1 is a block diagram illustrating an exemplary system, which is a power energy storage system comprising a battery power management unit (BPMU), in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

For purposes of the description hereinafter, it is to be understood that the embodiments described below may assume alternative variations and embodiments. It is also to be understood that the specific articles, compositions, and/or processes described herein are exemplary and should not be considered as limiting.

In the present disclosure the singular forms "a," "an," and "the" include the plural reference, and reference to a particular numerical value includes at least that particular value, unless the context clearly indicates otherwise. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

The present disclosure provides a battery power management unit (BPMU) for an electrical energy storage system, an electrical energy storage system comprising such a battery power management unit (BPMU), and methods of using the same.

Unless it is expressly stated otherwise, the acronyms are used herein for abbreviation. For example, "BESS" refers to a battery energy storage system, "BPMU" refers to a battery pack management unit, "SOH" refers to state of health, and "SOC" refers to state of charge.

The controller, the system, and the method provided in the present disclosure apply to different battery packs, which are heterogeneous battery packs. References to "heterogeneous battery packs" made herein refer to battery packs or modules having different capacity, SOC, and/or SOH, and can be selected from new batteries (e.g., from different manufacturers), second-use electric vehicle (EV) batteries, or combinations thereof. Second-use EV batteries are used for illustration purpose. References to "discharging" from or "charging" to the plurality of battery packs are understood that the plurality of batteries packs collectively discharge or be charged, while it is possible that some battery packs may stay idle (without charging or discharging).

Unless expressly indicated otherwise, references to "state of health (SOH)" made herein will be understood to mean a figure of merit of the condition of a battery, a battery cell, or a battery pack compared to its ideal conditions. SOH is characterized in percentage (%). The condition matching the specifications under the ideal conditions is 100%. SOH may decrease over time and use.

Unless expressly indicated otherwise, "state of charge" (SOC) described herein is defined as a level of charge of an electric battery relative to its capacity. The units of SOC are percentage points, 0% means empty, and 100% means full.

The term "human machine interface (HMI)" used herein is understood to refer to user interface (UI) is the space where interactions between humans and machines occur. A human-machine interface (HMI) may involve interfaces between human and machines with physical input hardware such as keyboards, mice, or any other human interaction based on tactile, visual, or auditory senses. Such user interfaces may include other layers such as output hardware such as computer monitors, speakers, and printers.

The term "controller area network" or "central area network" (CAN) used herein refers to a vehicle bus standard designed to allow microcontroller devices to communicate with each other's application without a host computer, and without wiring every individual components together.

The term "transmission control protocol/internet protocol (TCP/IP)" used herein is understood as a set of standardized rules that allow computers to communicate on a network such as internet.

The term "energy management system (EMS)" used herein refers to a system of computer-aided tools used by operators of electric utility grids to monitor, control, and optimize the performance of the generation or transmission system.

In the present disclosure, the terms "power demand" and "power requirement" are used interchangeably, and the terms "converter" and "inverter" can be used interchangeably. Each battery pack includes an inverter and a battery management unit (BMU) therein. For the convenience of description, the term "power inverter" is used to describe the internal component in a battery pack, and the term "power converter" or "power conversion system (PCS)" is used to describe the converter connected with one or more battery packs. The term of "battery management unit (BMU)" or "battery management system (BMS)" is used to describe the internal component in a battery pack, and the term "battery power management unit (BPMU)" is used to describe the battery management unit connected with one or more battery packs. The BPMU provided herein can be also called a battery management unit (BMU). The term BPMU is mostly used to distinguish from internal BMU in a battery pack.

Unless expressly indicated otherwise, the term "connected" or "coupled" used herein are understood to encompass different connections or coupling between or among the components so as to conduct electricity or transmit signals for communication. Such a connection or coupling can be through wire, wireless, or cloud-based modes.

Unless expressly indicated otherwise, references to "a system controller" made herein are understood to encompass a controller wired or connected via wireless or cloud based technology, and such a controller is used to control the energy storage system. For example, in some embodiments, such a controller uses cloud and internet based computing technology, and can perform calculation locally. Such a technology translates the languages of different sources such as inverter and BMS languages (e.g., CAN, Modbus, DNP3, or any other suitable language). Using such a technology, the controller and different devices or units in the system as described herein can communicate with each other. Modbus is a data communication protocol and a standard of communication protocol or means of connecting industrial electric devices.

Figure 7:
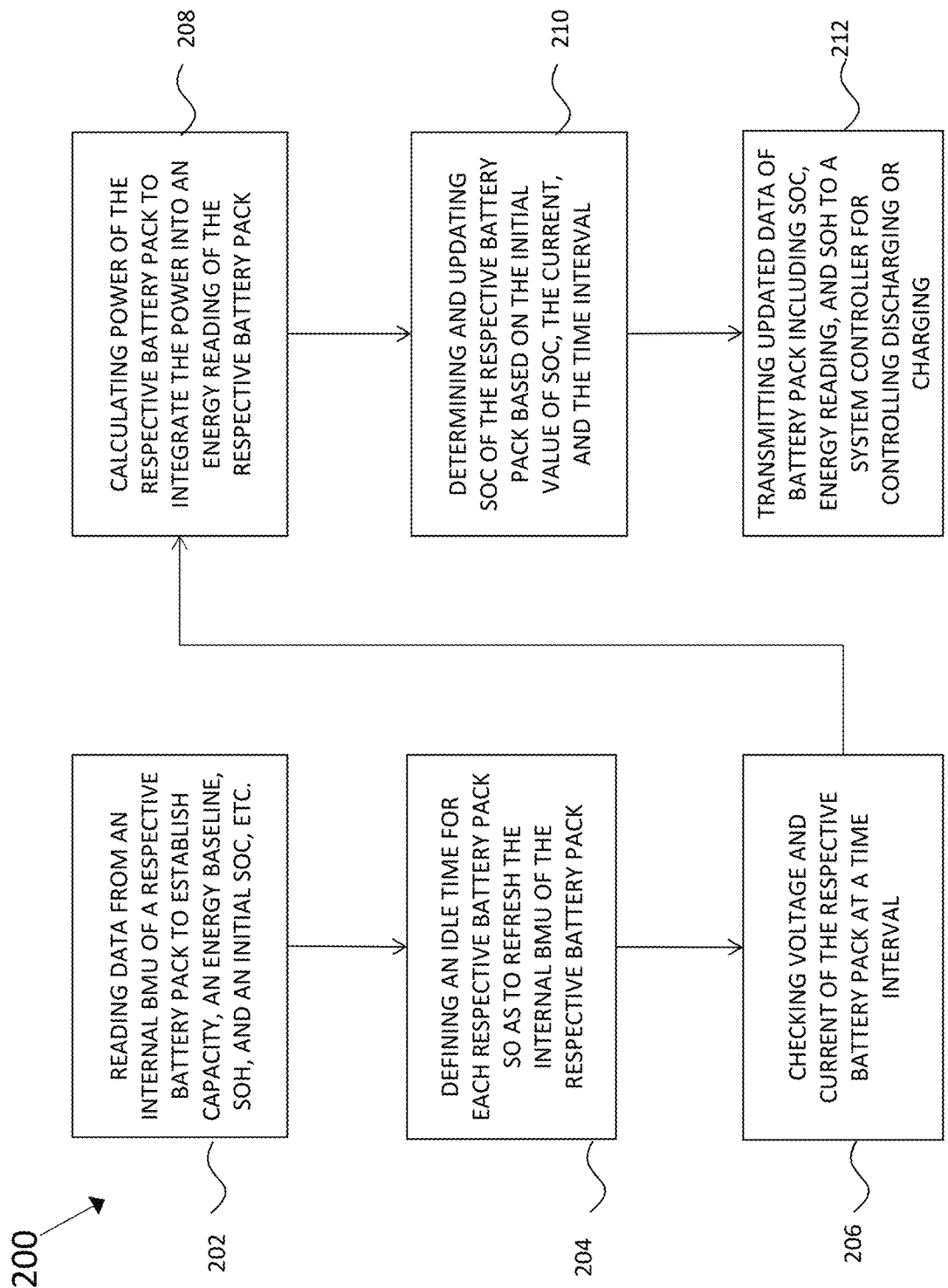
FIG. 7 is a flow chart illustrating an exemplary method for managing one or more battery packs in an energy storage system in accordance with some embodiments.
Figure 8:
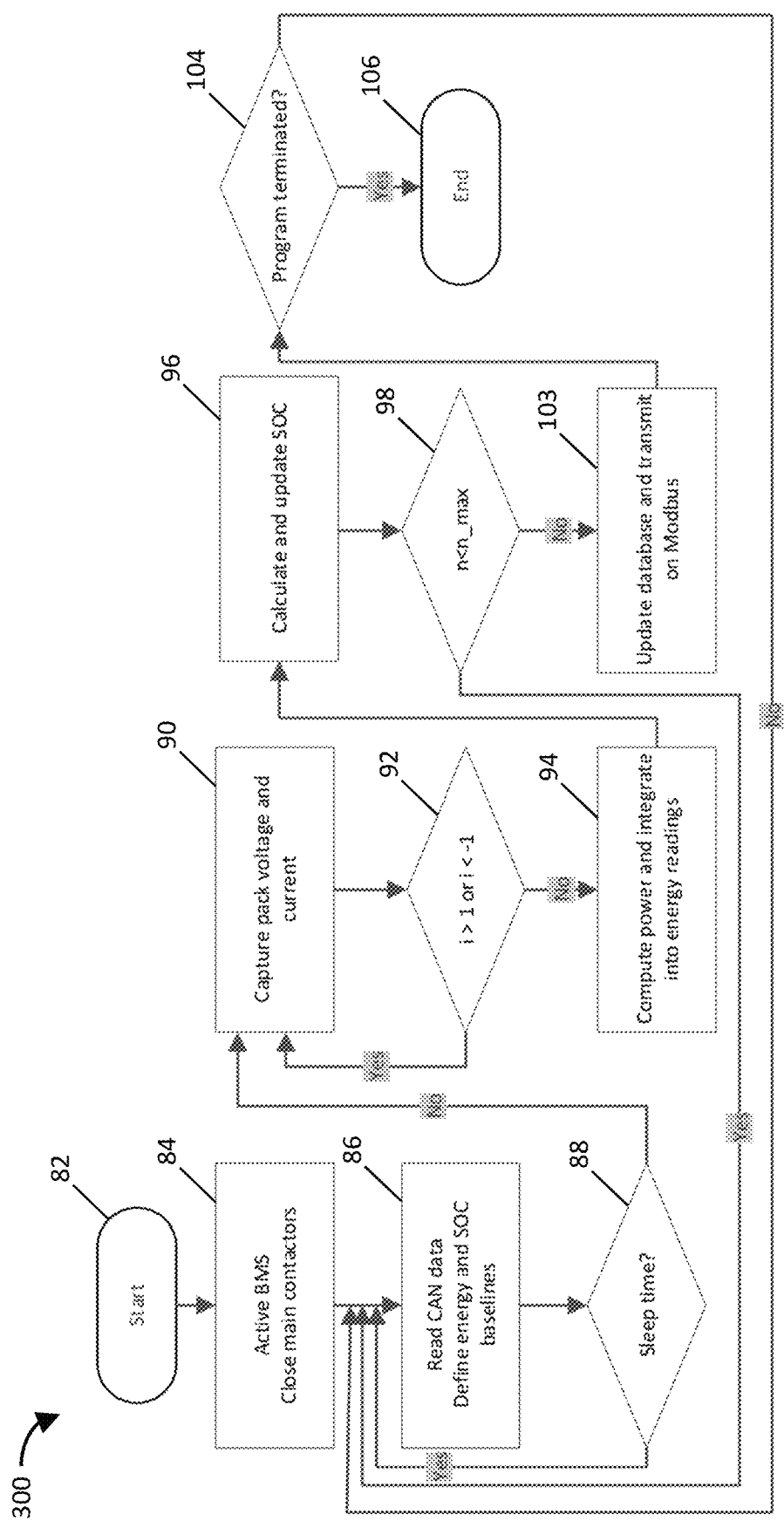
FIG. 8 is a flow chart illustrating an exemplary program for managing one or more battery packs in accordance with some embodiments.

In FIGS. 1-6, like items are indicated by like reference numerals, and for brevity, descriptions of the structure, provided above with reference to the preceding figures, are not repeated. The methods described in FIGS. 7 and 8 are described with reference to the exemplary structure described in FIGS. 1-6.

Figure 2:
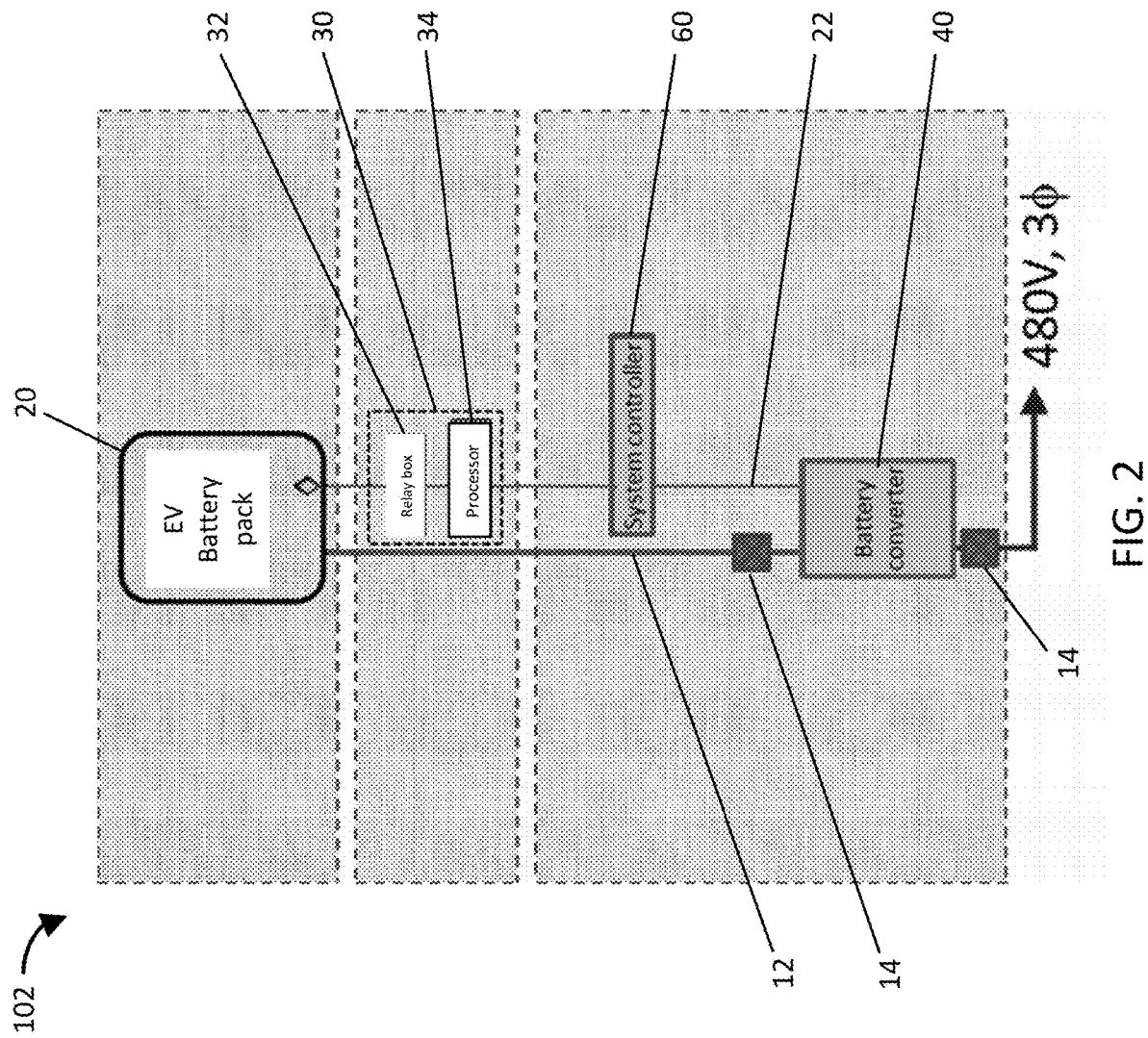
FIG. 2 is a block diagram illustrating an exemplary system according to the design of FIG. 1.

Referring to FIG. 1, a framework of an exemplary system 100, which is an energy storage system, is illustrated. FIG. 2 is an exemplary system 102 as an example of the system 100 in some embodiments. Such a system 100 (or 102) comprises a battery power management unit (BPMU) 30 in accordance with some embodiments.

Referring to FIGS. 1-2, in accordance with some embodiments, the energy storage system 100 comprises a plurality of battery packs 20, one or more battery power management unit (BPMU) 30, and a system controller 60. System 100 further comprises power converters 10, which is also called a power conversion system (PCS). The system controller 60 may be connected with other components in wire or wireless mode. The dotted lines 22 in FIG. 1 illustrate that the controller 60 can work in a cloud-based mode, and can work as a real-time local cloud. System 100 can be used for discharging power from battery packs 20 to a grid 85, or for charging from the grid 85 to battery packs 20. Wire connection 12 may be used. A busbar 80 may exist between the system 100 and the grid 85.

The plurality of battery packs 20 are connected in a parallel configuration 50. In some embodiments, the plurality of battery packs 20 are second-use (i.e. used) electric vehicle (EV) batteries. The used EV batteries having different capacity can be directly utilized in the system, without pre-selection or dismantling. As illustrated in FIG. 1, each battery pack 20 comprises a battery or batteries 21, an internal battery management unit (BMU) 25, and an inverter 40. EV battery packs 20 are removed from vehicles and are not disassembled into modules.

Referring to FIGS. 1-2, in some embodiments, system 100 may be connected directly to power grid 85, which may have a voltage in a range of from 300 volts to 480 volts (e.g., 400-480 volts). In some embodiments, the grid is a 480V 3-phase power grid. All components in the system 100, including HMI, converters, BPMUs, and protection relays, are linked or coupled to the system controller 60 through TCP/IP network. The controller 60 is networked with all components through TCP/IP 22. Users 55 can access the network.

Referring to FIG. 2, the exemplary system 102 is an example of system 100 for the illustration purpose only. System 102 (or 100) may include one or more BPMUs 30. Each BPMU 30 is connected with at least one battery pack 20 and is configured to monitor and control respective battery pack(s) 20. One BPMU 30 and one battery pack 20 are shown in FIG. 2 for illustration only. Each power converter 10 is coupled with at least one battery pack 20, for example, through wires 12. Power converter 10 is configured to convert direct current (DC) from a respective battery pack 20 to alternating current (AC) or vice versa.

The system controller 60 is connected with the power converter 10 and the BPMU 30, for example, through communication lines 22. The battery pack 20 having the internal battery management unit (BMU) 25 is also connected with the BPMU 30, which include a control box with a microcontroller 32 and one or more processor 34. The system controller 60 may be connected by wire or in wireless or cloud-based mode. In FIG. 1, all the connections between the controller 60 and other components can be wireless and clouded based. The connections among other components can be by wires in some embodiments. The power converter 10 controls whether or not to charge or discharge the battery pack 20. The controller 60 is configured to adjust charge/discharge rates depending on the conditions of the battery packs 20 such as SOC and SOH.

Referring to FIG. 2, the system 102 may further comprise a plurality automatic circuit breakers 14. One or two circuit breakers 14 may be disposed between a battery pack 20 and a respective power converter 10, and is configured to connect or disconnect a respective battery pack 20 and a respective power converter 10. Circuit breaker 14 can be used between the power converter 10 and the grid 85. The controller 60 also controls safety of the system by controlling circuit breakers 14 between power converters 10 and battery packs 20. A circuit breaker 14 will protect a respective EV battery pack 20 from inrush current and arcs while also starting the system. The controller 60 collects data of battery packs 20 and pre-charges the DC ports on the converters 10, then closes the circuit breakers 14 via function relays and switching motors on the circuit breakers.

Figure 3:
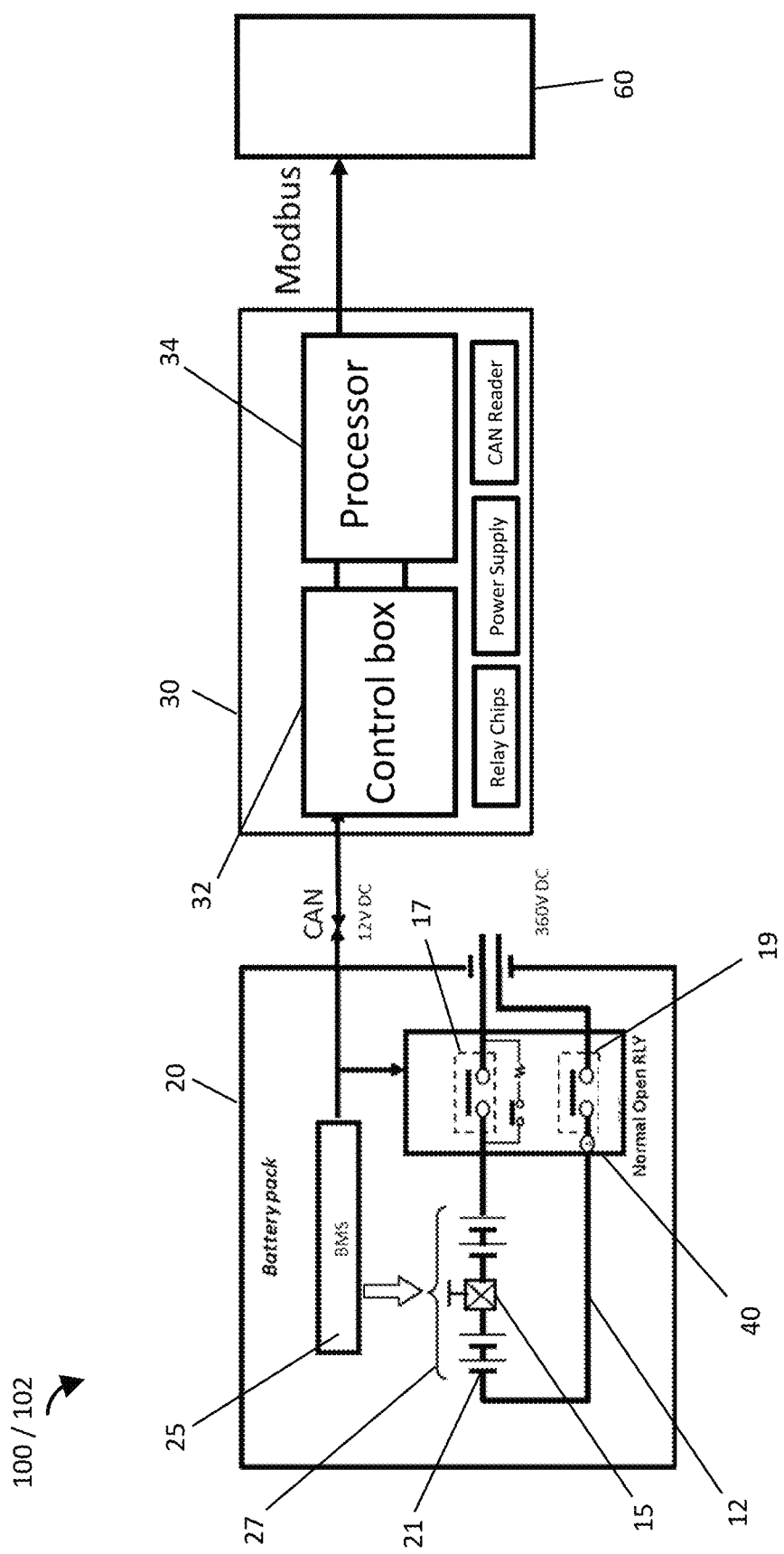
FIG. 3 is a block diagram illustrating a portion of the exemplary system comprising a battery power management unit (BPMU) in accordance with some embodiments.

Referring to FIG. 3, the BPMU 30 comprises at least two parts including a microcontroller 32 in a control box (or called relay box) and one or more processors 34 having programs, which are connected with wires 12. Each battery pack includes a battery set 27, an internal BMU 25 (or called BMS), and an inverter 40. The battery set 27 may include one or more batteries 21 connected with a disconnecting switch 15, which may include a plunger to be pulled out during a transfer. The inverter 40 may include at least two relays including a main relay 17 and a second relay 19. The microcontroller 32 is connected with the internal BMS 25 and the relays 17 and 19, for example, in a wireless mode.

As described herein, the microcontroller 32 is used to activate the internal BMU 25, turn on/off main battery contacts through the relays 17 and 19, and transmit CAN signal from between the BPMU 30 and the battery pack 20. The microcontroller 32 in the control box may be a controller such as a raspberry pi. The control box may further include relay chips and/or switches, a DC power supply in a range of from 5-24 volts (e.g., 12V), and one or more CAN readers. The processor 34 (e.g., a computer) may include one or more programs as described herein to read CAN, category data, calculate real-time data, translate the data into Modbus, and transmit the data out to the system controller 60. The program also has a function to pause the work above and refresh internal BMS. This is considered as battery sleeping period, which occurs in any suitable time period, for example, once in an operation day.

The BPMU 30 first activates internal BMS 25 of a battery pack and closes the main contacts of the battery. The detailed procedures may depend on the brands of EV battery packs. The CAN readers in the control box read CAN data from internal BMS of battery packs and send the data to the processor 34 (e.g., computer). The CAN readers are connected to communication ports of battery packs separately and read CAN data in sequence. The program in the computer gathers CAN data from CAN readers and separate the useful information for stationary energy storage applications.

Figure 4:
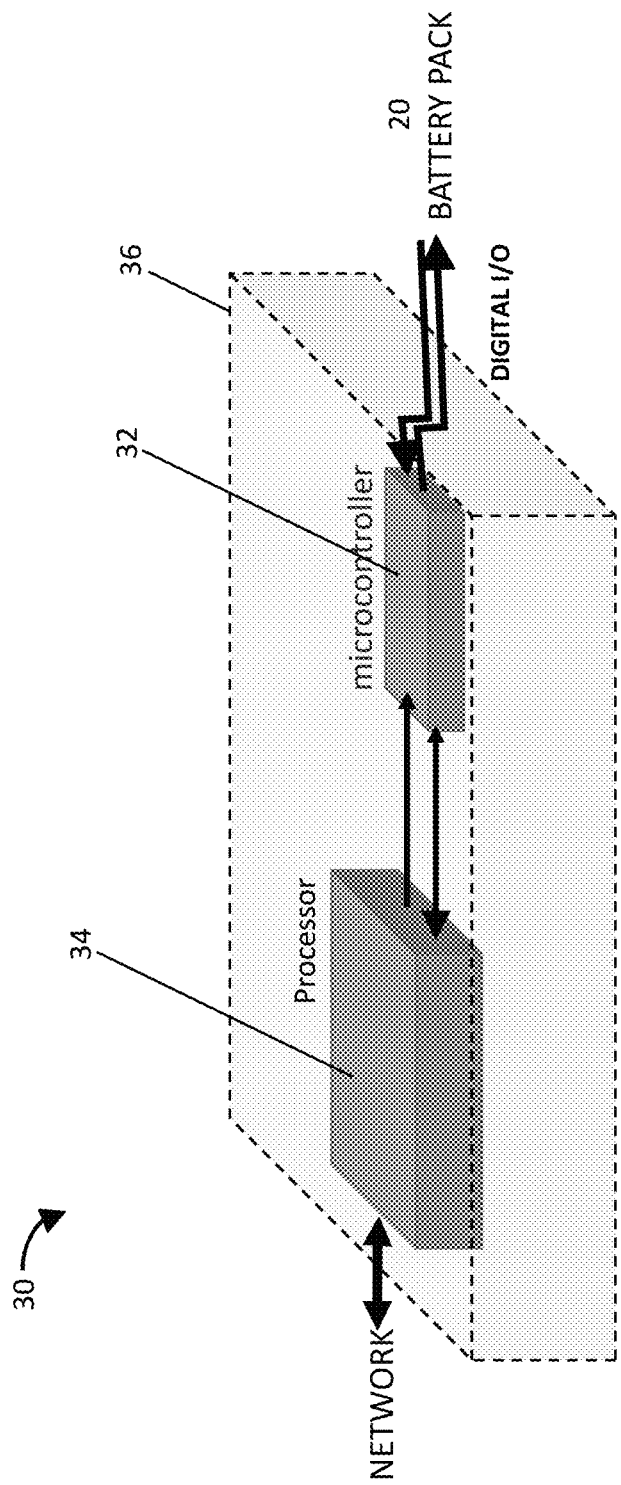
FIG. 4 illustrates an exemplary battery pack management units (BPMU) in accordance with some embodiments.

Referring to FIG. 4, an exemplary battery pack management units (BPMU) 30 is illustrated. The exemplary BPMU 30 comprises a microcontroller 32 and a processor 34 such as a personal computer inside an enclosure 36. The microcontroller 32 connects with and communicates with a respective battery pack 20 with a digital I/O interface. Through the microcontroller 32, the BPMU 30 is configured to monitor and control the respective battery packs 20, by coordinating with the controller 60. The microcontroller 32 and the processor 34 connect and communicate with each other. The processor 34 is connected with the network for the controller 60.

Figure 5:
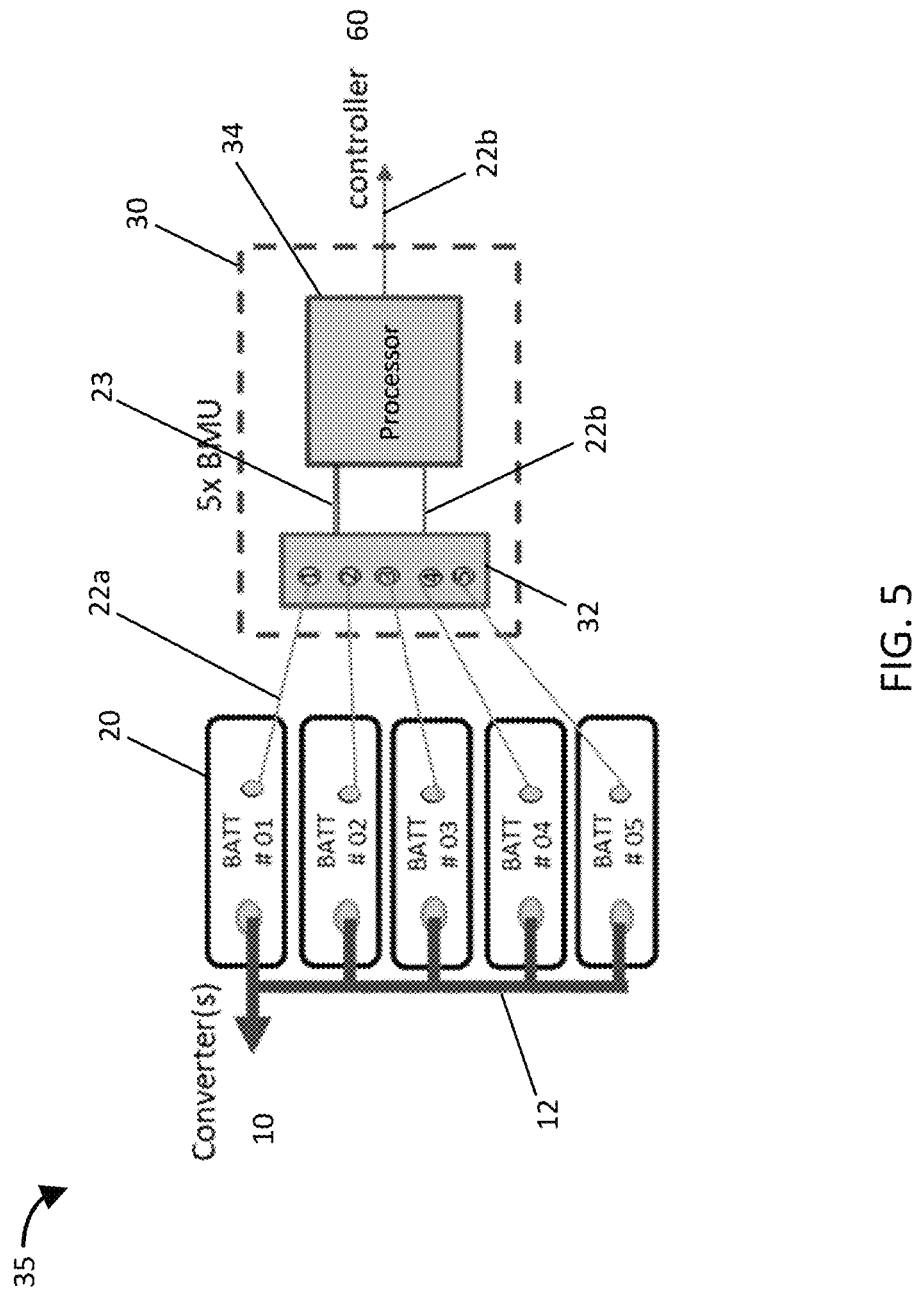
FIG. 5 is a block diagram illustrating a portion of the exemplary system comprising a battery power management unit (BPMU) connected with multiple battery packs in accordance with some embodiments.

Referring to FIG. 5, a portion of the exemplary system 100 or 102 is illustrated. In such a system, a battery power management unit (BPMU) 30 is connected with multiple battery packs 20 in accordance with some embodiments. Five battery packs 20 are shown in FIG. 5 for illustration only. Each battery packs includes a respective internal BMU. The battery packs 20 are connected to one or more power converters 10 through wire connection 12. The BPMU 30 includes a microcontroller 32 having multiple ports and CAN readers connected with the BMUs of battery pack, for example, wirelessly through CAN 22a. The BPMU also includes one or more processor 34 loaded with program. The microcontroller 32 may be connected and communicated with the processor 34 through Ethernet 22b and USB adapter 23 as illustrated in FIG. 5. The processor 34 may be connected with the system controller 60 wirelessly, for example, through Ethernet 22b. In FIG. 5, more CAN readers can be utilized to read CAN data from multiple packs. These CAN readers in the microcontroller 32 are connected to the processor 34 through USB port. A proper sequence can be created for the connected battery packs. The microcontroller 32 and the one or more processors 34 may be a system or a circuit board in some embodiments.

Referring to FIGS. 1-5, such an electrical energy storage system 100 (102) comprises a plurality of battery packs 20, one or more battery power management unit (BPMU) 30, one or more power converters 10, and a system controller 60. Each battery pack 20 comprises an internal BMU 25 (or called BMS). In some embodiments, the plurality of battery packs 20 are second-use electric vehicle (EV) batteries connected in parallel. The used EV batteries can be directly utilized in the system, without pre-selection or dismantling. Each battery pack comprises an inverter and an internal battery management unit (BMU) in the pack.

Each BPMU 30 is connected with at least one battery pack 20. The BPMU 30 comprises a microcontroller 32 in a control box (or called relay box) and one or more processors 34 (e.g., computer) having at least one tangible, non-transitory machine readable medium encoded with one or more programs.

Figure 6:
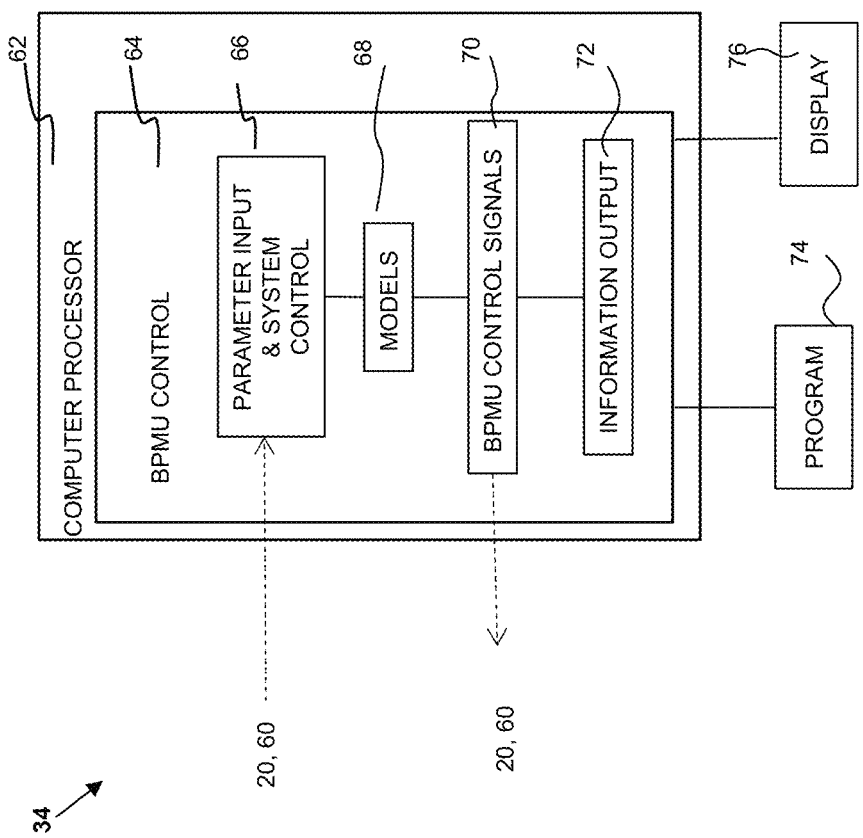
FIG. 6 is a block diagram illustrating an exemplary BPMU or computer implemented unit comprising one or more processors and at least one tangible, non-transitory machine readable medium encoded with one or more programs, for managing one or more battery packs in accordance with some embodiments.

Referring to FIG. 6, an exemplary BPMU 30 comprises one or more processors 62 and at least one tangible, non-transitory machine readable medium encoded with one or more programs 74 to be executed by the one or more processors 62 and/or the microcontroller 32, for managing one or more battery packs in accordance with some embodiments. The processor(s) 62 may include a central battery management unit control 64, which includes a parameter input module 66, model module 68, a signal control module 70, and information and instruction output module 72. The parameter input module 66 coordinates with the battery packs 20 and read the data from battery packs 20. Together with the one or more programs 74, the model module 68 is configured to perform a simulation based on the input parameters to provide information and instruction to the BPMU control module 70 and the information and instruction output module 72. The processors 62 may be optionally connected with one or more displays 76 for displaying the information and instructions from module 72 and to an operator.

The BPMU 30 is configured to perform steps as described herein. These steps include: reading data from the internal BMU 30 of the respective battery pack 20 to establish capacity, an energy baseline, and an initial value of state of charge (SOC) of the respective battery pack, checking voltage and current of the respective battery pack 20 at a time interval, calculating power of the respective battery pack 20 to integrate the power into an energy reading of the respective battery pack 20, and determining and updating state of charge (SOC) of the respective battery pack based on the initial value of SOC, the current, and the time interval. Each power converter 10 is coupled with at least one battery pack and is configured to convert direct current (DC) from a respective battery pack 20 to alternating current (AC) or vice versa. The system controller 60 is used for controlling discharging power from or charging power to the respective battery pack 20 based on updated data including the SOC and the energy reading of each respective battery.

In some embodiments, each BPMU 30 is also configured to determine state of health (SOH) of each respective battery pack 20 based on the capacity of the respective battery pack 20. A suitable technique including, but not limited to, Coulomb counting, electrochemical impedance measurement, or a combination thereof can be used in determining the SOH and the SOC of each respective battery pack 20. The system controller 60 is configured to control discharging or charging each respective battery based on the SOH and the SOC of each respective battery pack 20, and a power command from an upper level energy management system (EMS) 38. Each BPMU 30 is also configured to transmit the updated data of each respective battery pack 20 such as the SOH, the SOC and the power or energy reading to the system controller 60.

In some embodiments, each BPMU 30 is also configured to define an idle time for each respective battery pack so as to refresh the internal BMU of the respective battery pack. In some embodiments, each BPMU 30 further includes at least one CAN reader in the microcontroller, relay chips, and a power supply. The power supply has power output matched to those of the internal BMU of the respective battery and the CAN reader or readers. In some embodiments, the power supply is in the range of from 5 volts to 24 volts.

The present disclosure provides a system and a method for monitoring and controlling battery packs 30 that are retired from electric vehicles (EV) and are planned to be used in stationary energy storage applications. The battery packs 20 are used without being disassembled into their individual components. The battery packs 20 include internal modules, cells, battery management systems (internal BMS) 25 that are used as is. The external battery management unit (BMU, or called BPMU) 30 is developed for one or multiple battery packs 20 out of EVs. The BPMU 30 activates the internal battery management systems (BMS) 25, reads CAN data, screens data into parameters that are used to calculate and update critical values such as SOC and SOH. These data are then used to make determinations regarding operating algorithms for battery usage for a system controller 60.

In another aspect, the present disclosure also provides a battery power management unit (BPMU) 30 for an electrical energy storage system 100 or 102 as described herein. The BPMU 30 comprises a microcontroller 32 configured to be connected with at least one battery pack 20, and one or more processors (such as a computer) 34 connected with the microcontroller 32. The one or more processors 34 have at least one tangible, non-transitory machine readable medium encoded with one or more programs. The battery packs 20 are second-use electric vehicle (EV) battery pack as described herein.

The BPMU 30 is configured to perform steps of: reading data from the internal BMU 25 of a respective battery pack 20 to establish capacity, an energy baseline, and an initial value of state of charge (SOC) of the respective battery pack 20, checking or measuring voltage and current of the respective battery pack 20 at a time interval, calculating power of the respective battery pack 20 to integrate the power into an energy reading of the respective battery pack, and determining and updating state of charge (SOC) of the respective battery pack 20 based on the initial value of SOC, the current, and the time interval. In some embodiments, the BPMU 30 is also configured to determine state of health (SOH) of each respective battery pack 20 based on the capacity of the respective battery pack 20. A suitable technique such as Coulomb counting, electrochemical impedance measurement, or a combination thereof can be used in determining the SOH and the SOC of each respective battery pack 20. The BPMU 30 is further configured to transmit updated data of the respective battery pack 20 including the SOC, the SOH, and the energy reading to a system controller for controlling discharging power from or charging power to the respective battery pack 20 based on the updated data of the respective battery pack 20. The system controller 60 is configured to control discharging or charging each respective battery based on the SOH and the SOC of each respective battery pack, and a power command from an upper level energy management system (EMS) 38. In addition, the BPMU 30 is also configured to define an idle time for each respective battery pack so as to refresh the internal BMU 25 of the respective battery pack 20. In some embodiments, each BPMU 30 further includes at least one CAN reader in the microcontroller 32, relay chips, and a power supply, which has power output matched to those of the internal BMU 25 of the respective battery 20 and the at least one CAN reader. The CAN bus is used as example in this disclosure. The BPMU 30 can work with any other communication protocols, such as MODBUS.

Redundant data from the internal BMS 25 is removed and non-functional parameters are re-estimated and updated accordingly in the external BPMU 30. The updated parameters are then used by the system controller 60 to make decision through algorithms for battery operation. The BPMU 30 provides real time and reliable data for the system controller 60 rather than directly using the information from the internal BMU 25 of a battery pack 20.

In some embodiments, the system and the method provided in the present disclosure do not rely on testing methods such as electrochemical impedence spectroscopy (EIS) to determine the SOH, and but may rely on the SOC and SOH values coming from the internal BMU 25 of a battery pack 20. One objective to calculate accurately the real time SOC and SOH values of second-use EV battery packs 20 used in the system.

The internal BMU (or BMS) 25, originally designed for vehicles by the Original Equipment Manufacturer (OEM) may be used as a data source for to calculate real time information. The BPMU 30 is also used to make decisions regarding battery pack operation by conveying the real-time calculations to the system controller 60. The internal BMUs 25 are not designed for stationary energy storage application, and their functions are limited after being removed from the EVs. The BPMUs and the method provided herein inspect the limitation and improve real-time calculations on energy levels and demonic values of state of charge (SOC) of battery packs. The BPMU 30 can enhance functions of internal BMU 25 of a battery pack 20 and provide better reference values for system applications. In some embodiments, the BPMU 30 collects data from internal BMU 25 and verify accuracy and compute real-time values of battery status, updates and transmits data in the form of Modbus via TCP/IP. Engineering assumptions are made to closely represent real time battery status. The BPMU 30 also refreshes data from the internal BMS at a defined time frame to adjust for accuracy.

Referring to FIG. 7, an exemplary method 200 is illustrated for using a battery power management unit (BPMU) 30 to manage one or more battery packs 20 in an energy storage system 100 or 102, or for operating such a system 100 or 102 in accordance with some embodiments. In accordance with some embodiments, such a method 200 comprises the steps descried herein using the BPMU 30.

At step 202, data from an internal BMU 25 of a respective battery pack 20 among a plurality of battery packs are read. The capacity, an energy baseline, and an initial value of state of charge (SOC) of the respective battery pack 20 are established. As described herein, the plurality of battery packs 20 are selected from new batteries, second-use electric vehicle (EV) battery packs or combinations thereof, which are connected in parallel. In some embodiments, the state of health (SOH) of each respective battery pack 20 is also determined based on its capacity. The SOH in percentage (%) can be determined by dividing the capacity by its maximum capacity of a brand-new battery pack based on the specification. The SOH may decrease over time and use. An initial SOC in percentage (%) can be determined by dividing a current level of charge of an electric battery relative to its capacity.

In some embodiments, the internal BMS 25 of a battery pack 20 may not give proper readings on SOH, due to differences in packs first-life use in EVs or other different applications. An engineering assumption based on history of the pack is made to estimate the SOH. A constant base capacity (rated energy as original pack) is used in this step.

At step 204, which may be optional, an idle time (i.e., sleeping period) is defined for each respective battery pack 20 so as to refresh the internal BMU 25 of the respective battery pack 20.

The stationary applications require battery packs are always active. Variance on calculated values, especially energy and SOC could become large. Re-estimate energy baseline is necessary once in 24 hours. The BMU emulates car shut down condition for pack and let internal BMS work to update battery parameters. While a pack is sleeping, a sleep indagator signal will triggered and sent to upper level controller to pause system operation. In the BMU, managing multi-packs of battery, the sleep actions are performed in a sequence for all packs.

At step 206, voltage and current of the respective battery pack 20 are checked or measured at a time interval.

At step 208, the power of the respective battery pack 20 is calculated to integrate the power into an energy reading of the respective battery pack 20. The power can be calculated based on the voltage and the current, and the energy can be calculated based on based on the voltage, the current, and the time. Floating current may be ignored in the calculation.

At step 210, state of charge (SOC) of the respective battery pack 20 is determined and updated based on the initial value of SOC, the current, and the time interval. In some embodiments, a suitable technique such as Coulomb counting, electrochemical impedance measurement, or any other suitable techniques, or a combination thereof is used for determining the SOH and the SOC of each respective battery pack.

Coulomb counting is a technique used to track the state of charge of a battery pack. It works by integrating the active flowing current (in amps) over time to derive the total sum of energy entering or leaving the battery pack. For example, the SOC of a battery pack 20 at any given time can be calculated following Equation:

$$SOC(t) = SOC(t-\Delta t) + I(t)*\Delta t/Qn \qquad (1), or$$

$$SOC(t) = SOC(t_0) + \int_0^t I(t)dt/Qn \qquad (2),$$

where SOC(t) and SOC(t−Δt) are the state of charge of the battery pack at time (t) and (t−Δt), respectively, SOC($t_0$) is an initial SOC, Δt is a time interval, I(t) is the current and Qn is the capacity of the battery pack. I(t) may be represented as negative during discharging and positive as charging.

If the current is record as positive values, Equations (1) and (2) for a discharging process are represented as Equations:

$$SOC(t)=SOC(t-\Delta t)-I(t)*\Delta t/Qn \qquad (3), \text{ and}$$

$$SOC(t)=SOC(t_0)-\int_0^t I(t)dt/Qn \qquad (4).$$

Taking one example, in some embodiments, it is assumed that a new EV battery pack has a maximum capacity of 30 kWh rated capacity. After 7-8 years of service in a car, the battery pack is retired at 80% SOH (or less). Then the battery pack has a second life starting at a capacity Qn of 24 kWh, which is 30 kWh×80%. The SOC can be estimated by coulomb counting or similar methods. The daily base energy E0 is captured while starting and/or resuming from sleep. Energy value is computed as E=E0+ΣV*I, and the real-time SOC=E/Qn.

Steps from step 202 to step 210 can be reiterated for each battery pack 20.

At step 212, the updated data of the respective battery pack 20 including the SOC and the energy reading is transmitted to a system controller 60, which is for controlling discharging power from or charging power to the respective battery pack 20 based on the updated data of the respective battery pack. The SOH and the SOC of each respective battery 20 pack, and a power command from an upper level energy management system (EMS) 38. Are used by the system controller 60 for controlling discharging or charging each respective battery. For example, a power distribution rate is calculated for each of a plurality of battery packs 20 connected in parallel. The battery packs 20 having higher capacity and high SOH and/or SOC can be preferably used for discharging to meet the power demand from EMS 38. An exemplary method of controlling discharging or charging using a system controller is described in the inventors' co-pending U.S. application Ser. No. 17/201,529.

Referring to FIG. 8, an exemplary flow chart 300 is used to illustrate an exemplary program and the method 200 for managing one or more battery packs in accordance with some embodiments.

At block 82, the system is started. At block 84, the BPMU 30 activates the internal BMS 25 of a battery pack and close the main contacts. The detailed procedures may depend on the brand of EV battery packs. At block 86, the CAN readers in the control box read CAN data from the internal BMS 25 of each battery pack 20 and send the data to the processor 34. The CAN readers are connected to communication ports of each battery pack 20 separately and read CAN data in sequence. The program in the computer gathers CAN data from CAN readers and separate the useful information for stationary applications. As described at step 202 of FIG. 7, the data are used to establish capacity, an energy baseline, and an initial value of state of charge (SOC) of the respective battery pack 20. In the program, the energy capacity baseline (i.e. total operable capacity of a new battery pack, Qn) and voltage boundary (Vlow and Vhigh according to the OEM specifications), information provided by battery manufactures, are selected. Baselines, such as energy, SOC values, are determined according to the information from the internal BMS 25. Using these baselines, energy and SOC are calculated and updated in real time. Battery pack voltage, average pack temperatures, fail codes, and SOH are also gathered from BMS.

At block 88, a sleep time is defined for each single pack to refresh internal BMS 25. When the sleep time is set and passes, the BPMU 30 returns to read the data again. If the sleep time is not set, at block 90, the voltage and the current of each respective battery are checked and recorded. During discharging (represented by "i<−1" in FIG. 8) or charging (represented by "i>1"), the voltage and the current at any time will be kept updated by cycling back to block 90. When a respective battery is not charged or discharged, at block 94, the power of the respective battery pack 20 is calculated to integrate the power into an energy reading of the respective battery pack 20 as described in step 208 of FIG. 7. At block 96, state of charge (SOC) of the respective battery pack 20 is determined and updated based on the initial value of SOC, the current, and the time interval as described in step 210 of FIG. 7. The steps from block 86 to block 96 can be reiterated if the number of reiteration is less than a pre-determined maximum number of re-iterations ("n_max") at block 98. When the number of reiteration reaches the pre-determined maximum number, at block 103, the updated data of the respective battery pack 20 including the SOC and the energy reading is transmitted to a system controller 60, for example, through Modbus, as described in step 212 of FIG. 7. The program can be terminated at block 104 and 106. Otherwise, the steps may be repeated if needed.

Due to circulating current, which may exist, even at idle mode miscalculation may happen and affect estimating energy and SOC. In some embodiments, the total current less than 1 Amp (i.e. absolute value of i less than 1) is ignored, and a corresponding limit is set and provided to the upper system controller. The energy and SOC are calculated using voltage and current to better represent the condition of battery packs.

Examples

In the exemplary system 102 of FIG. 2, charging/discharging tests were conducted, and results are shown in FIGS. 9-12.

Figure 9:
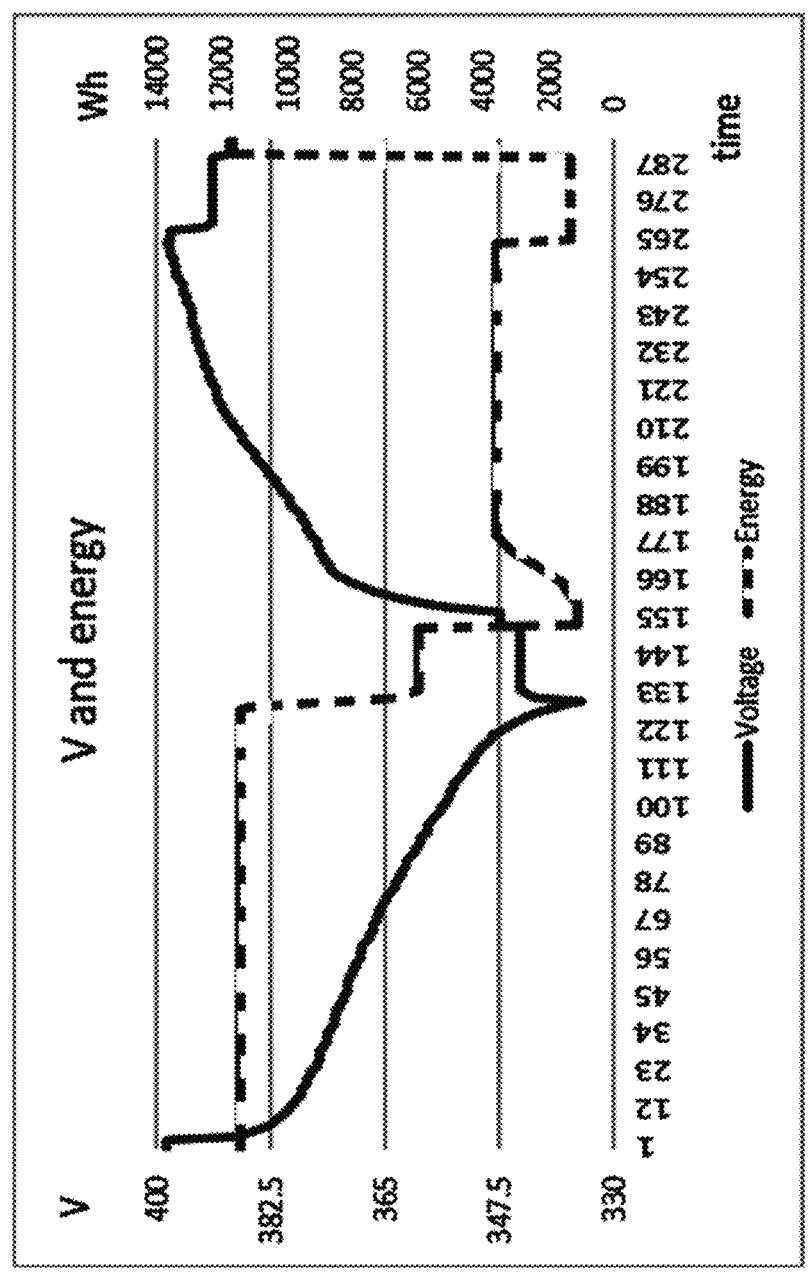
FIG. 9 shows the changes in energy read directly from an internal BMS of a battery pack and the corresponding voltage with time during a charging and discharging test in a control experiment.
Figure 10:
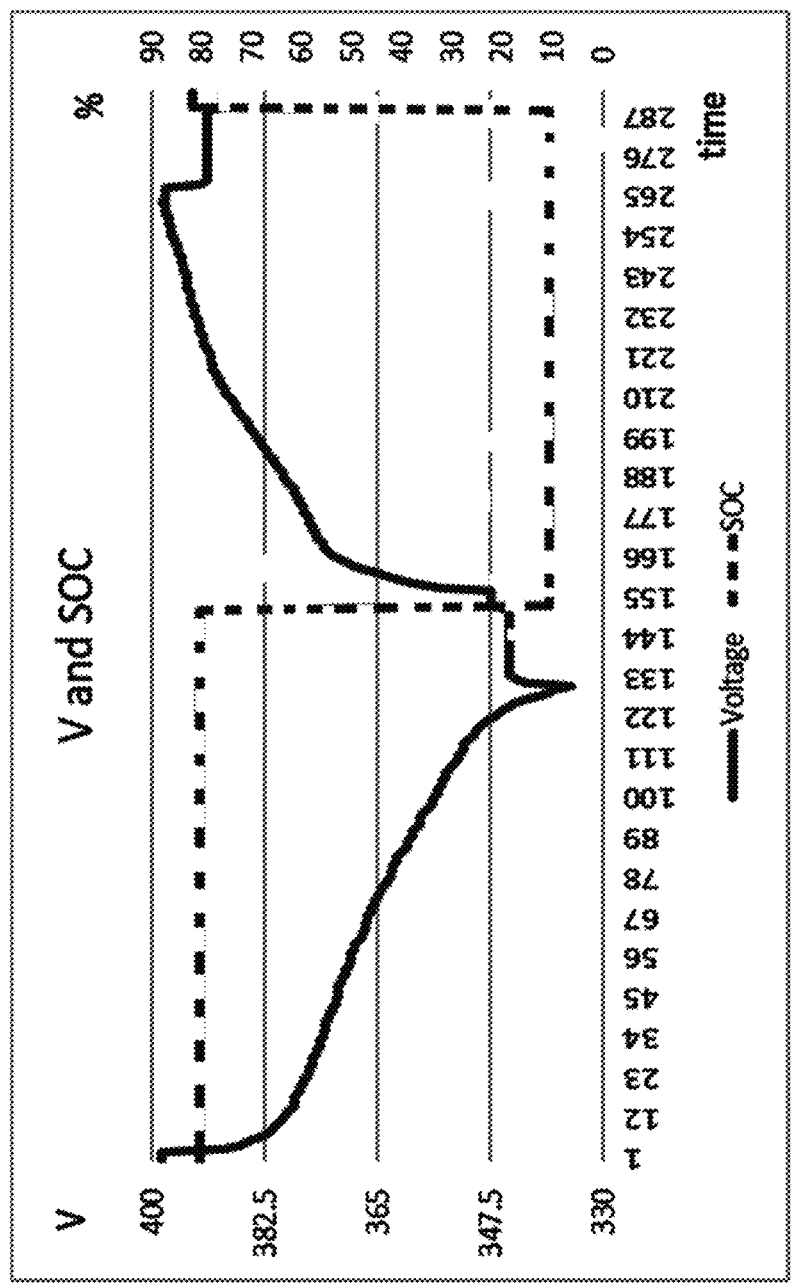
FIG. 10 shows the changes in SOC read directly from an internal BMS of a battery pack and the corresponding voltage with time during a charging and discharging test in the control experiment.

FIGS. 9-10 show the changes in energy and SOC read directly from an internal BMS of a battery pack and the corresponding voltage with time during a charging and discharging test in a control experiment. The energy and SOC readings were obtained directly from the internal BMS. The values did not represent the status of the batteries accurately. A sleep/wake up action was performed at the points after discharging and charging the battery.

Figure 11:
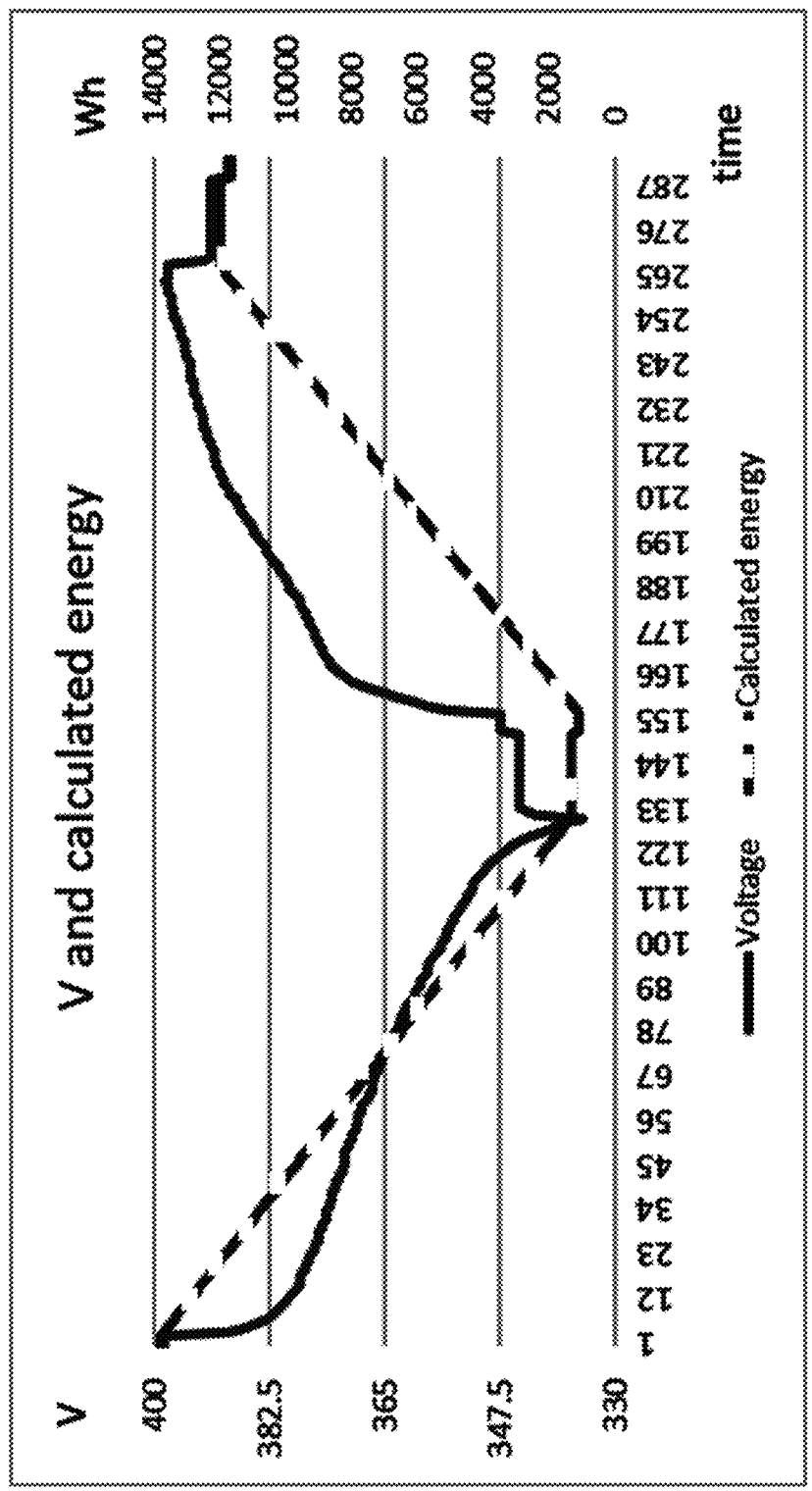
FIG. 11 shows the change in calculated energy of the battery pack with time at the corresponding voltage during a charging and discharging test in an experiment.
Figure 12:
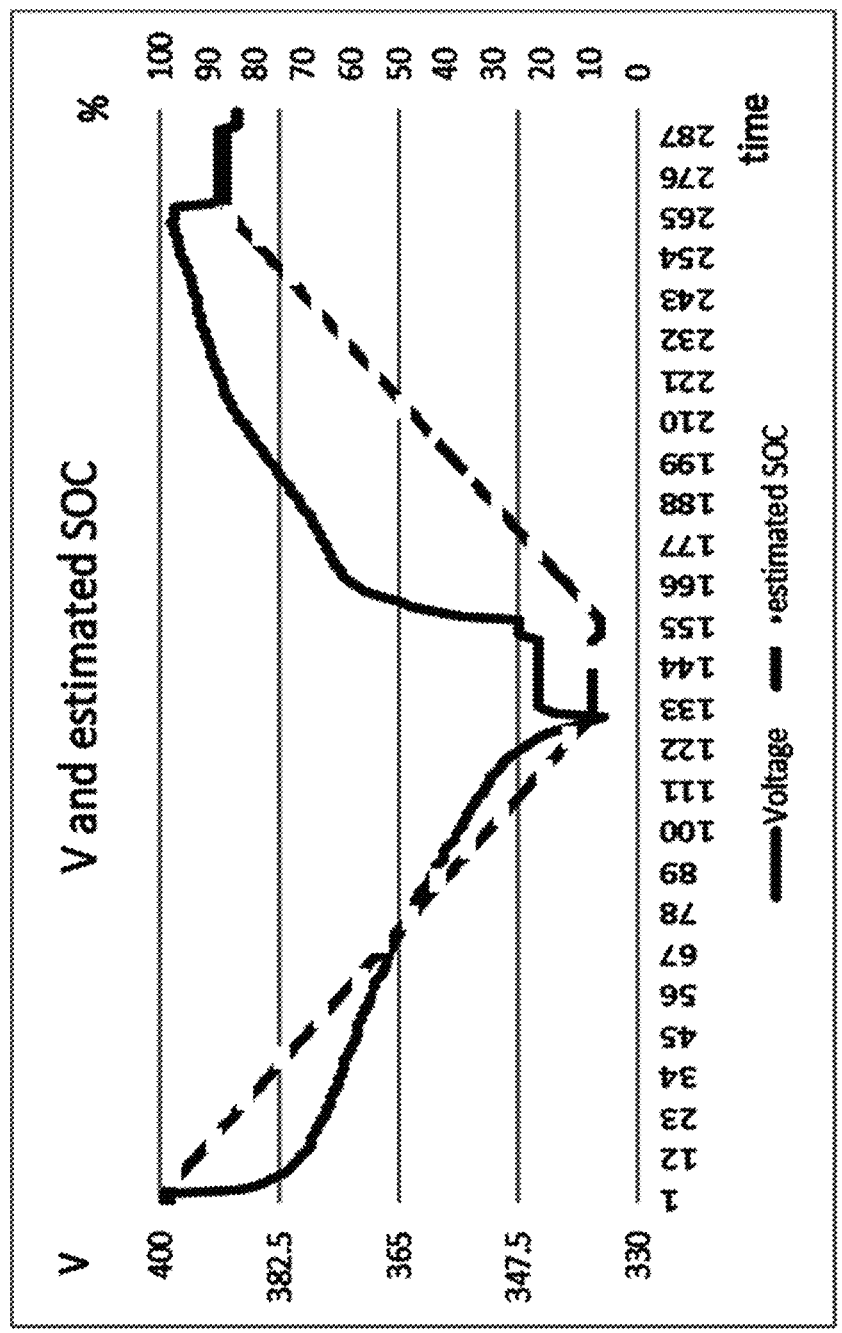
FIG. 12 shows the change in SOC of a battery pack with time at the corresponding voltage during a charging and discharging test in the experiment.

FIGS. 11-12 show the change in calculated energy and the SOC of the battery pack with time at the corresponding voltage during a charging and discharging test in an experiment. Accurate and real-time values such as the energy and SOC of a battery pack are obtained.

The BPMU, the system comprising the BPMU, and the methods provided in the present disclosure have many advantages. For example, the BPMU determine and provide real-time and reliable data of the battery packs, which are second-use EV batteries directly used in the system without dissembling. Such real-time and accurate data of battery packs are provided to the system controller for decision-making, for example, controlling discharging or charging the battery packs with better control. The life-time of the battery packs can be also extended through better control.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, or any combination of these mediums, wherein, when the computer program code is loaded into and executed by a computer, the computer becomes an apparatus for practicing the method. The methods may also be at least partially embodied in the form of a computer into which computer program code is loaded and/or executed, such that, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods. The computer or the control unit may be operated remotely using a cloud based system.

Although the subject matter has been described in terms of exemplary embodiments, it is not limited thereto. Rather, the appended claims should be construed broadly, to include other variants and embodiments, which may be made by those skilled in the art.

What is claimed is:

1. An electrical energy storage system, comprising:
   a plurality of battery packs, each battery pack comprising an internal battery management unit (BMU);
   one or more battery power management unit (BPMU), each BPMU connected with at least one battery pack, comprising a microcontroller and one or more processors having at least one tangible, non-transitory machine readable medium encoded with one or more programs, and configured to perform steps of:
      reading data from the internal battery management unit of the respective battery pack to establish capacity, an energy baseline, and an initial value of state of charge (SOC) of the respective battery pack;
      defining an idle time for each respective battery pack so as to refresh the internal battery management unit of the respective battery pack, wherein the idle time is the time when the battery pack is not charged or discharged;
      checking voltage and current of the respective battery pack at a time interval;
      calculating power of the respective battery pack to integrate the power into an energy reading of the respective battery pack; and
      determining and updating state of charge (SOC) of the respective battery pack based on the initial value of SOC, the current, and the time interval;
   one or more power converters, each power converter coupled with at least one battery pack and configured to convert direct current (DC) from a respective battery pack to alternating current (AC) or vice versa; and
   a system controller for controlling discharging power from or charging power to the respective battery pack based on updated data including the SOC and the energy reading of each respective battery.

2. The system of claim 1, wherein the plurality of battery packs are heterogeneous battery packs connected in parallel selected from new batteries, second-use electric vehicle (EV) batteries, or combinations thereof.

3. The system of claim 1, wherein each BPMU is also configured to transmit the updated data of each respective battery pack to the system controller.

4. The system of claim 1, wherein each BPMU further includes at least one controller area network reader in the microcontroller, relay chips, and a power supply having power output matched to those of the internal battery management unit of the respective battery and the at least one controller area network reader.

5. The system of claim 1, wherein each BPMU is also configured to determine state of health (SOH) of each respective battery pack based on the capacity of the respective battery pack.

6. The system of claim 5, wherein a technique including Coulomb counting, electrochemical impedance measurement, any other SOC estimation technique, or a combination thereof is used in determining the SOH and the SOC of each respective battery pack.

7. The system of claim 5, wherein the system controller is configured to control discharging or charging each respective battery based on the SOH and the SOC of each respective battery pack, and a power command from an upper level energy management system (EMS).

8. A battery power management unit (BPMU) for an electrical energy storage system, comprising:
   a microcontroller configured to be connected with at least one battery pack;
   one or more processors connected with the microcontroller and having at least one tangible, non-transitory machine readable medium encoded with one or more programs, and the BPMU configured to perform steps of:
      reading data from the internal battery management unit of a respective battery pack to establish capacity, an energy baseline, and an initial value of state of charge (SOC) of the respective battery pack;
      defining an idle time for each respective battery pack so as to refresh the internal battery management unit of the respective battery pack, wherein the idle time is the time when the battery pack is not charged or discharged;
      checking voltage and current of the respective battery pack at a time interval;
      calculating power of the respective battery pack to integrate the power into an energy reading of the respective battery pack;
      determining and updating state of charge (SOC) of the respective battery pack based on the initial value of SOC, the current, and the time interval; and
      transmitting updated data of the respective battery pack including the SOC and the energy reading to a system controller for controlling discharging power from or charging power to the respective battery pack based on the updated data of the respective battery pack.

9. The BPMU of claim 8, wherein the at least one battery pack includes heterogeneous battery packs selected from new batteries, second-use electric vehicle (EV) batteries, or combinations thereof.

10. The BPMU of claim 8, wherein each BPMU further includes at least one controller area network reader in the microcontroller, relay chips, and a power supply having power output matched to those of the internal battery management unit of the respective battery and the at least one controller area network reader.

11. The BPMU of claim 8, wherein the BPMU is also configured to determine state of health (SOH) of each respective battery pack based on the capacity of the respective battery pack.

12. The BPMU of claim 11, wherein a technique including Coulomb counting, electrochemical impedance measurement, or a combination thereof is used in determining the SOH and the SOC of each respective battery pack.

13. The BPMU of claim 11, wherein the system controller is configured to control discharging or charging each respective battery based on the SOH and the SOC of each respective battery pack, and a power command from an upper level energy management system (EMS).

14. A method for using a battery power management unit (BPMU) in an electrical energy storage system, comprising:
   reading data from an internal battery management unit of a respective battery pack among a plurality of battery packs to establish capacity, an energy baseline, and an initial value of state of charge (SOC) of the respective battery pack;
   defining an idle time for each respective battery pack so as to refresh the internal battery management unit of the respective battery pack, wherein the idle time is the time when the battery pack is not charged or discharged;
   checking voltage and current of the respective battery pack at a time interval;
   calculating power of the respective battery pack to integrate the power into an energy reading of the respective battery pack;
   determining and updating state of charge (SOC) of the respective battery pack based on the initial value of SOC, the current, and the time interval; and
   transmitting updated data of the respective battery pack including the SOC and the energy reading to a system controller for controlling discharging power from or charging power to the respective battery pack based on the updated data of the respective battery pack.

15. The method of claim 14, wherein the plurality of battery packs are heterogeneous battery packs connected in parallel selected from new batteries, second-use electric vehicle (EV) batteries, or combinations thereof.

16. The method of claim 14, further comprising determining state of health (SOH) of each respective battery pack based on the capacity of the respective battery pack, wherein the SOH and the SOC of each respective battery pack, and a power command from an upper level energy management system (EMS) are used by the system controller for controlling discharging or charging each respective battery.

17. The method of claim 16, wherein a technique including Coulomb counting, electrochemical impedance measurement, any other SOC estimation technique, or a combination thereof is used in determining the SOH and the SOC of each respective battery pack.

* * * * *